(12) United States Patent
Agrawal et al.

(10) Patent No.: US 8,495,436 B1
(45) Date of Patent: Jul. 23, 2013

(54) SYSTEM AND METHOD FOR MEMORY TESTING IN ELECTRONIC CIRCUITS

(75) Inventors: Deepak Agrawal, Ghaziabad (IN);
Rachna Lalwani, Gachibowli (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/525,353

(22) Filed: Jun. 17, 2012

(51) Int. Cl.
*G11C 29/00* (2006.01)

(52) U.S. Cl.
USPC .......... 714/710; 714/718; 714/6.1; 714/6.13; 714/6.3; 714/6.32; 714/41; 714/42; 714/711; 714/723; 714/733; 714/734; 365/200; 365/201; 326/10

(58) Field of Classification Search
None
See application file for complete search history.

(56) References Cited

U.S. PATENT DOCUMENTS

| | | | |
|---|---|---|---|
| 5,987,632 A | 11/1999 | Irrinki | |
| 6,181,614 B1 | 1/2001 | Aipperspach | |
| 7,257,745 B2 | 8/2007 | Huott | |
| 7,589,552 B1 * | 9/2009 | Guzman et al. | 326/10 |
| 7,624,225 B2 | 11/2009 | Gower | |
| 8,255,771 B2 * | 8/2012 | Ito et al. | 714/764 |
| 2007/0104000 A1 * | 5/2007 | Lin et al. | 365/200 |
| 2008/0209283 A1 * | 8/2008 | Gupta et al. | 714/718 |
| 2011/0029813 A1 | 2/2011 | Gunderson | |
| 2011/0145645 A1 * | 6/2011 | Volkerink et al. | 714/35 |
| 2012/0230136 A1 * | 9/2012 | Gorman et al. | 365/200 |

* cited by examiner

*Primary Examiner* — John Trimmings
(74) *Attorney, Agent, or Firm* — Charles Bergere

(57) ABSTRACT

An electronic circuit includes first and second circuits that include corresponding built-in-self-test (BIST) engines to perform memory testing operations on corresponding first and second memory block and generate first and second memory repair data. A multiplexer receives the first and second memory repair data and selectively transmits the first memory repair data during a first test cycle and the second memory repair data during a second test cycle. A shadow register buffers the first memory repair data during the first test cycle and a fuse processor sequentially receives and stores the first and second memory repair data during the second test cycle.

18 Claims, 3 Drawing Sheets

SYSTEM AND METHOD FOR MEMORY TESTING IN ELECTRONIC CIRCUITS

BACKGROUND OF THE INVENTION

The present invention relates generally to electronic circuits, and more particularly, to electronic circuit memory testing and repair.

Electronic circuits such as microprocessors, microcontrollers (MCUs), systems-on-chips (SOCs), and application specific integrated circuits (ASICs) are widely used in various applications including industrial applications, automobiles, home appliances, and handheld devices. These electronic circuits include multiple circuit modules such as hard and soft IP cores, digital logic gates, flip-flops, and latches. A circuit module often includes one or more memory blocks for storing data. Memory locations within the memory blocks are required to function properly when a read/write operation is performed. However, due to various factors including process, voltage and temperature (PVT) variations, and overheating of the electronic circuit, some memory locations may be damaged.

A memory testing mechanism, typically referred to as a built-in-self-test (BIST) engine, is provided in an electronic circuit to test memory locations within a memory block and generate memory test data. Additionally, each memory block has a corresponding repair register that stores the memory test data, i.e., the memory repair data, generated by the corresponding BIST engine. The BIST engine transmits memory repair data to a fuse processor that permanently burns the repair data to a fuse storage device in the electronic device. When the electronic circuit is switched on, the fuse processor fetches the memory repair data from the fuse storage device and provides it to a corresponding BIST engine. The BIST engines use the memory repair data to prevent a faulty memory location from being used during a memory read/write operation.

Since electronic circuits may include multiple circuit modules that operate at different frequencies, handshaking logic is used to synchronize the frequencies during a memory repair operation.

FIG. 1 shows a schematic block diagram of an exemplary conventional electronic circuit 100. The electronic circuit 100 includes first through third circuit modules 102a-102c (collectively referred to as circuit modules 102), handshake logic 104, fuse processor 106, and fuse storage device 108. The first through third circuit modules 102a-102c include corresponding first through third memory blocks 110a-110c (collectively referred to as memory blocks 110), corresponding first through third BIST engines 112a-112c (collectively referred to as BIST engines 112), and corresponding first through third repair registers 114a-114c (collectively referred to as repair registers 114), respectively. The fuse processor 106 includes a programmable data register 116.

An output terminal of the third repair register 114c is connected to an input terminal of the second repair register 114b and an output terminal of the second repair register 114b is connected to an input terminal of the first repair register 114a, by way of the handshaking logic 104. An output terminal of the first repair register 114a is connected to an input terminal of the programmable data register 116. An output terminal of the programmable data register 116 is connected to the fuse storage device 108. The first circuit module 102a may include a processor core, such as a digital signal processor (DSP) or a power processor core. The second and third circuit modules 102b and 102c may include digital circuits, such as flip-flops, logic gates, latches, and combinations thereof.

An external testing apparatus (not shown) is connected to the electronic circuit 100 to initiate the BIST engines 112 and test the corresponding memory blocks 110. The external testing apparatus may be connected to a suitable test interface, such as a joint test action group (JTAG) interface of the electronic circuit 100, which is further connected to each BIST engine 112. The BIST engines 112 generate different test patterns for testing the corresponding memory blocks 110.

The first circuit module 102a operates at a first clock frequency and the second and third circuit modules 102b and 102c operate at a second clock frequency. The external testing apparatus configures the first circuit module 102a and initiates a memory repair operation on the first memory block 110a by initiating the first BIST engine 112a. The first BIST engine 112a tests the first memory block 110a and generates first memory repair data that is stored in the first repair register 114a. Since the operating frequency (first clock frequency) of the first circuit module 102a is different from the operating frequencies (second clock frequency) of the second and third circuit modules 102b and 102c, the first memory repair data is transferred to the fuse processor 106 during a first test cycle by way of the handshake logic 104. The handshake logic 104 operates at the second clock frequency and synchronizes the first memory repair data with the second clock frequency. The programmable data register 116 receives and transfers the first memory repair data to the fuse storage device 108.

Thereafter, the external testing apparatus configures the second and third circuit modules 102b and 102c and initiates corresponding second and third BIST engines 112b and 112c, which in turn launch memory repair operations on the second and third memory blocks 110b and 110c respectively, in a second test cycle. The second and third memory blocks 110b and 110c generate second and third memory repair data that are stored in the second and third repair registers 114b and 114c, respectively. The second and third circuit modules 102b and 102c transfer the second and third memory repair data to the fuse processor 106, during the second test cycle, by way of the handshake logic 104. The handshake logic 104 synchronizes with the first clock frequency when the second and third memory repair data enters the first repair register 114a and with the second clock frequency when the second and third memory repair data exit the first repair register 114a. The programmable data register 116 receives and transfers the first memory repair data to the fuse storage device 108, which permanently stores the second and third memory repair data. Thus, the first and second memory repair data are independently and separately transmitted to the fuse processor 106, which increases overall memory test and repair time considerably.

Therefore, it would be advantageous to reduce memory test and repair time, and eliminate the above-mentioned shortcomings of conventional electronic circuits.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
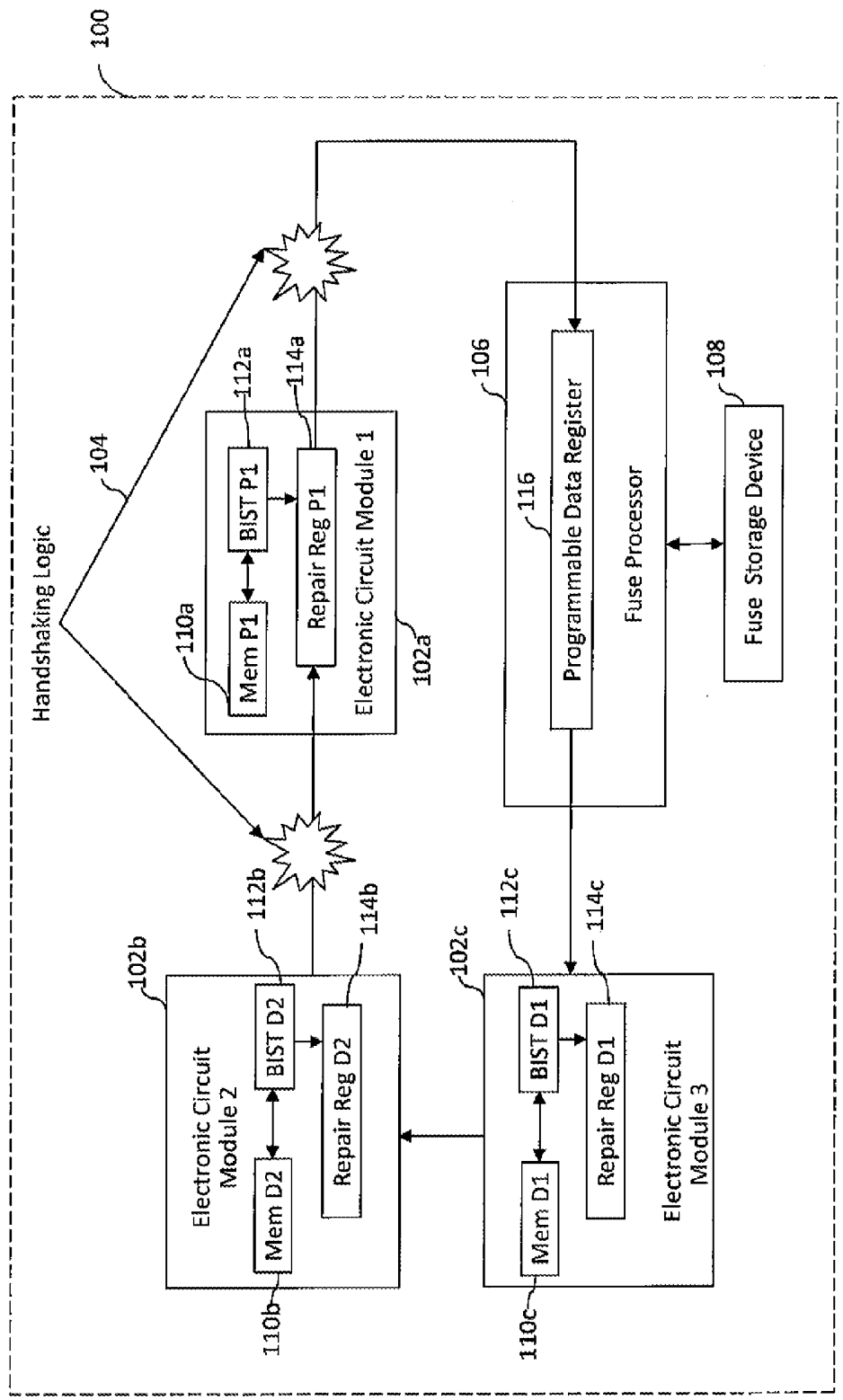
FIG. 1 is a schematic block diagram of an exemplary conventional electronic circuit.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. In the description, the term multiplexer has been abbreviated as mux.

In an embodiment of the present invention, a system for testing an electronic circuit is provided. The electronic circuit includes first and second electronic circuit modules. The first electronic circuit module operates on a first clock frequency and includes a first memory block, and the second electronic circuit operates on a second clock frequency and includes a second memory block. The first and second electronic circuit modules generate first and second memory repair data corresponding to the first and second memory blocks respectively. The system includes a multiplexer, a shadow register, and a fuse processor. The multiplexer has a first input terminal for receiving the first memory repair data, a second input terminal for receiving the second memory repair data, and a select input terminal for receiving a select signal. The multiplexer selectively transmits the first memory repair data during a first test cycle corresponding to the first clock frequency and the second memory repair data during a second test cycle corresponding to the second clock frequency. The shadow register is connected to an output terminal of the multiplexer and buffers the first memory repair data during the first test cycle. The fuse processor sequentially receives and stores the first and second memory repair data during the second test cycle. The second memory repair data is transmitted to the fuse processor by way of the shadow register.

In another embodiment of the present invention, an electronic circuit is provided. The electronic circuit includes first electronic circuit module, second electronic circuit module, a multiplexer, a shadow register and a fuse processor. The first electronic circuit module includes a first memory block, a first built-in-self-test (BIST) engine and a first repair register. The first built-in-self-test (BIST) engine tests the first memory block and generates first memory repair data and the first repair register stores the first memory repair data. Similarly, the second electronic circuit includes second memory block, second built-in-self-test (BIST) engine, and second repair register. The multiplexer has a first input terminal connected to the first repair register for receiving the first memory repair data, a second input terminal connected to the second repair register for receiving the second memory repair data, and a select input terminal that receives a select signal. The multiplexer selectively transmits the first memory repair data during a first test cycle corresponding to the first clock frequency and the second memory repair data during a second test cycle corresponding to the second clock frequency. The shadow register is connected to an output terminal of the multiplexer and buffers the first memory repair data during the first test cycle. The fuse processor sequentially receives and stores the first and second memory repair data during the second test cycle. The second memory repair data is transmitted to the fuse processor by way of the shadow register.

In yet another embodiment of the present invention, a method for testing an electronic circuit by an external testing apparatus is provided. The electronic circuit includes first and second electronic circuit modules that operate on first and second clock frequencies. The first and second electronic circuit modules include first and second memory blocks and first and second built-in-self-test (BIST) engines respectively. The first BIST engine is initiated to generate first memory repair data corresponding to the first memory block during a first test cycle corresponding to the first clock frequency. The first memory repair data is stored in a shadow register. Thereafter, the second BIST engine is initiated to generate a second memory repair data corresponding to the second memory block during a second test cycle corresponding to the second clock frequency. The first and second memory repair data are transmitted sequentially to a fuse processor by way of the shadow register, during the second test cycle.

Various embodiments of the present invention provide an electronic circuit with reduced memory testing and repair time, and reduced test costs. The electronic circuit includes first and second electronic circuit modules. The first electronic circuit modules includes a first memory block and a first built-in-self-test (BIST) engine for testing the first memory block during a first test cycle and generating a first memory repair data. Similarly, the second electronic circuit modules includes a second memory block and a second BIST engine for testing the second memory block during a second test cycle and generating a second memory repair data. The electronic circuit further includes a shadow register for buffering the first memory repair data during the first clock cycle. The first and second memory repair data are sequentially transmitted to a fuse processor during the second clock cycle, as opposed to two test cycles required for the conventional electronic circuits using handshaking logics, thereby reducing the test time and costs of the electronic circuit. The shadow register further eliminates the requirement of a handshaking logic.

Figure 2:
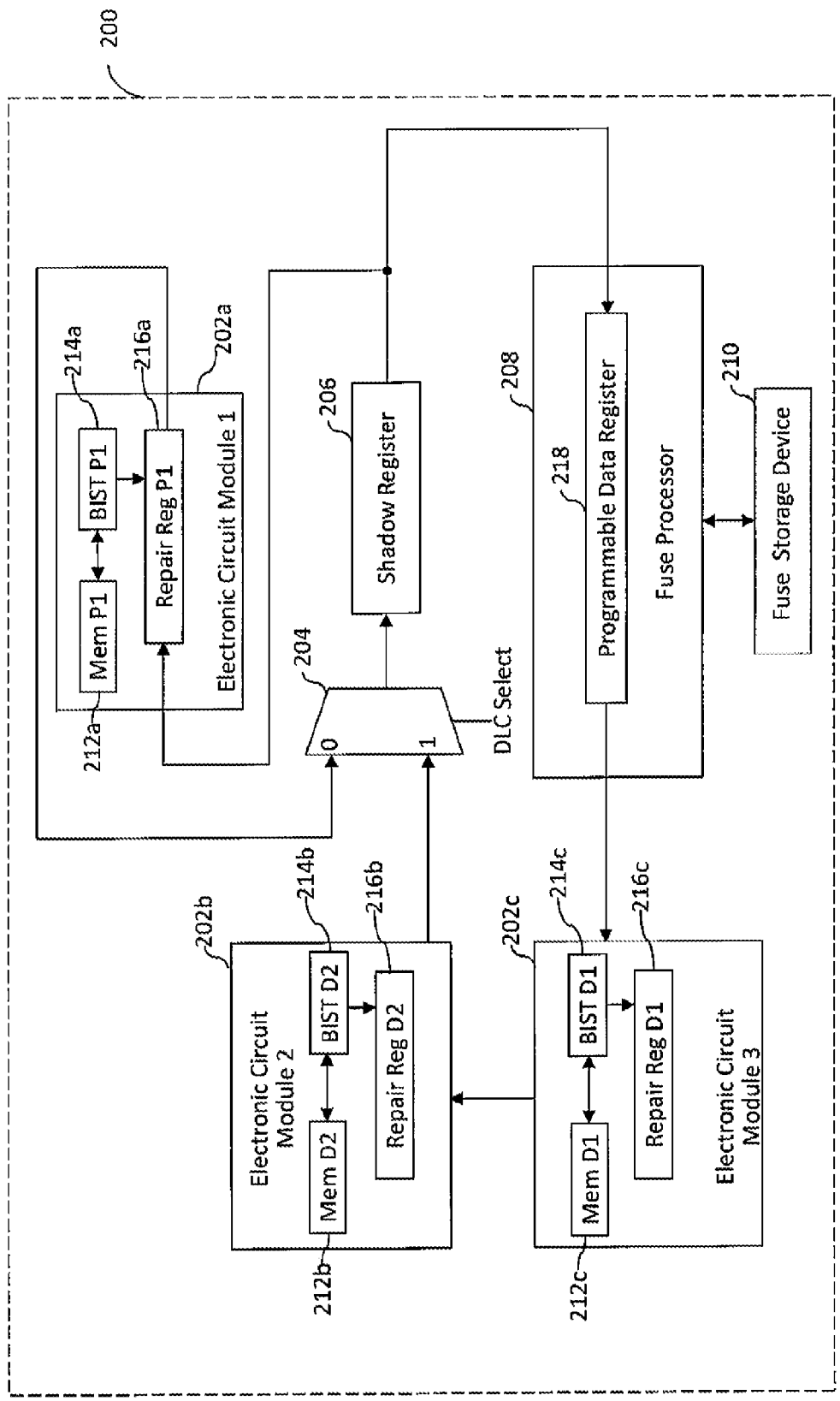
FIG. 2 is a schematic block diagram of an electronic circuit in accordance with an embodiment of the present invention.

Referring now to FIG. 2, a schematic block diagram of an electronic circuit 200, in accordance with an embodiment of the present invention, is shown. The electronic circuit 200 includes first through third electronic circuit modules 202a-202c (collectively referred to as electronic circuit modules 202), a mux 204, a shadow register 206, a fuse processor 208 and a fuse storage device 210. The first through third electronic circuit modules 202a-202c include corresponding first through third memory blocks 212a-212c (collectively referred to as memory blocks 212), corresponding first through third BIST engines 214a-214c (collectively referred to as BIST engines 214), and corresponding first through third repair registers 216a-216c (collectively referred to as repair registers 216) respectively. The fuse processor 208 includes a programmable data register 218.

In an embodiment of the present invention, the first electronic circuit module 202a may be a processor core, such as a digital signal processor (DSP) or a power processor core. The second and third electronic circuit modules 202b and 202c may be digital electronic circuits, such as digital flip-flop circuits, digital logic gate circuits, digital latch circuits, and combinations thereof.

An output terminal of the third repair register 216c is connected to an input terminal of the second repair register 216b. An output terminal of the second repair register 216b is connected to a first input terminal of the mux 204. An output terminal of the first repair register 216a is connected to a second input terminal of the mux 204. An output terminal of the mux 204 is connected to the shadow register 206. An output terminal of the shadow register 206 is connected to an input terminal of the programmable data register 218. An output terminal of the programmable data register 218 is connected to the fuse storage device 210.

The first electronic circuit module 202a operates on a first clock frequency and the second and third electronic circuit modules 202b and 202c operate on a second clock frequency. In an embodiment of the present invention, the shadow register 206 is capable of operating on both the first and second clock frequencies.

An external testing apparatus (not shown) is connected to the electronic circuit 200 to configure the electronic circuit modules 202 and initiate the BIST engines 214 for testing corresponding memory blocks 212. The external testing apparatus may be connected to a suitable test interface such as a joint test action group (JTAG) interface of the electronic circuit 200, which is further connected to each BIST engine 214. The BIST engines 214 generate different test patterns for testing the corresponding memory blocks 212.

The external testing apparatus initiates a first test cycle on the electronic circuit 200 and initiates the first BIST engine 214a. The first BIST engine 214a tests the first memory block 212a and generates first memory repair data that is stored in the first repair register 216a. The external testing apparatus provides an input select signal at a select terminal of the mux 204 (logic zero in this case) that causes the first memory repair data to shift from the first repair register 216a to the shadow register 206 where it is buffered.

Thereafter, the external testing apparatus initiates a second test cycle on the electronic circuit 200 and initiates the second and third BIST engines 214b and 214c. The second and third BIST engines 214b and 214c test the second and third memory blocks 212b and 212c and generate second and third memory repair data that are stored in the corresponding second and third repair registers 216b and 216c. The first memory repair data is transmitted from the shadow register 206 to the fuse processor 208. At the same time, the external testing apparatus provides an input select signal at a select terminal of the mux 204 (logic one in this case) that causes the second and third memory repair data to sequentially transmit from the second and third repair registers 216b and 216c to the fuse processor 208, by way of the shadow register 206. The programmable data register 218 receives and transmits the first, second and third memory repair data sequentially to the fuse storage device 210 for permanent storage. The fuse storage device 210 provides the memory repair data to the respective BIST engines 214 when the electronic circuit 200 is switched on. As the first, second and third memory repair data are sequentially transmitted to the fuse processor 208 in a single test cycle as opposed to two test cycles required for conventional test systems, the test time and test costs of the electronic circuit 200 are considerably reduced. It will be appreciated by a skilled artisan that although the present invention is described for only three electronic circuit modules 202, any other number of electronic circuit modules that operate on different frequencies may be present.

Figure 3:
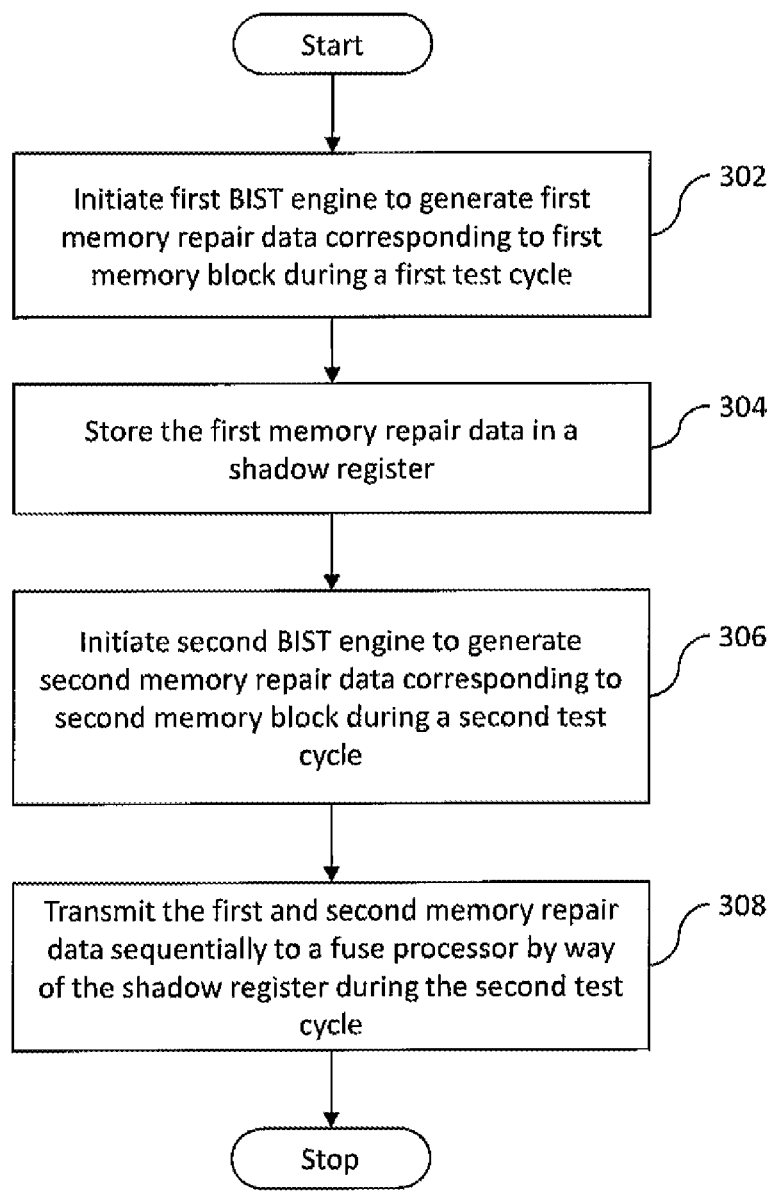
FIG. 3 is a flow diagram depicting a method for testing an electronic circuit in accordance with an embodiment of the present invention.

Referring now to FIG. 3, a flow diagram depicting a method for testing an electronic circuit, in accordance with an embodiment of the present invention, is shown. References will be made to FIG. 2 during the description of FIG. 3.

At step 302, during a first test cycle, the external testing apparatus initiates the first BIST engine 214a that tests the first memory block 212a and generates first memory repair data that is stored in the corresponding first repair register 216a. At step 304, the first electronic circuit module 202a transmits the first memory repair data to the shadow register 206, by way of the mux 204. The first memory repair data is buffered in the shadow register 206. At step 306, during the second test cycle, the external testing apparatus initiates the second and third BIST engines 214b and 214c that test the second and third memory blocks 212b and 212c, respectively, and generate second and third memory repair data that are stored in the corresponding second and third repair registers 216b and 216c. At step 308, the first memory repair data is transmitted from the shadow register 206 to the fuse processor 208. At the same time, the second and third memory repair data are sequentially transmitted to the fuse processor 208, by way of the mux 204 and the shadow register 206. The first, second and third memory repair data are then transmitted sequentially to the fuse processor 208 during the second test cycle.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A system for testing an electronic circuit including first and second electronic circuit modules that operate on first and second clock frequencies and include first and second memory blocks respectively, wherein the first and second electronic circuit modules generate first and second memory repair data corresponding to the first and second memory blocks respectively, comprising:
    a multiplexer having a first input terminal for receiving the first memory repair data, a second input terminal for receiving the second memory repair data, and a select input terminal for receiving a select signal, wherein the multiplexer selectively transmits the first memory repair data during a first test cycle corresponding to the first clock frequency and the second memory repair data during a second test cycle corresponding to the second clock frequency;
    a shadow register, connected to an output terminal of the multiplexer, for buffering the first memory repair data during the first test cycle; and
    a fuse processor, connected to the shadow register, for sequentially receiving and storing the first and second memory repair data during the second test cycle.

2. The system of claim 1, wherein the second memory repair data is transmitted to the fuse processor by way of the shadow register.

3. The system of claim 1, wherein the fuse processor includes a programmable data register for sequentially receiving the first and second memory repair data.

4. The system of claim 3, wherein the fuse processor further includes a fuse storage device for storing the first and second memory repair data.

5. The system of claim 4, wherein the programmable data register transmits the first and second memory repair data to the fuse storage device.

6. The system of claim 1, wherein the fuse processor provides the first and second memory repair data to the first and second electronic circuit modules respectively, when the electronic circuit transitions from an OFF state to an ON state.

7. The system of claim 1, wherein the select signal is generated based on the first and second test cycles.

8. An electronic circuit, comprising:
a first electronic circuit module operating on a first clock frequency, including:
a first memory block;
a first built-in-self-test (BIST) engine for testing the first memory block and generating first memory repair data; and
a first repair register for storing the first memory repair data;
a second electronic circuit module operating on a second clock frequency, including:
a second memory block;
a second built-in-self-test (BIST) engine for testing the second memory block and generating second memory repair data; and
a second repair register for storing the second memory repair data;
a multiplexer having a first input terminal connected to the first repair register for receiving the first memory repair data, a second input terminal connected to the second repair register for receiving the second memory repair data, and a select input terminal that receives a select signal, wherein the multiplexer selectively transmits the first memory repair data during a first test cycle corresponding to the first clock frequency and the second memory repair data during a second test cycle corresponding to the second clock frequency;
a shadow register, connected to an output terminal of the multiplexer, for buffering the first memory repair data during the first test cycle; and
a fuse processor, connected to the shadow register, for sequentially receiving and storing the first and second memory repair data during the second test cycle.

9. The electronic circuit of claim 8, wherein the second memory repair data is transmitted to the fuse processor by way of the shadow register.

10. The electronic circuit of claim 8, wherein the fuse processor includes a programmable data register for sequentially receiving the first and second memory repair data.

11. The electronic circuit of claim 10, wherein the fuse processor further includes a fuse storage device for storing the first and second memory repair data.

12. The electronic circuit of claim 11, wherein the programmable data register transmits the first and second memory repair data to the fuse storage device.

13. The electronic circuit of claim 8, wherein the fuse processor provides the first and second memory repair data to the first and second electronic circuit modules respectively, when the electronic circuit transitions from an OFF state to an ON state.

14. The electronic circuit of claim 8, wherein the select signal is generated based on the first and second test cycles.

15. The electronic circuit of claim 8, wherein the first electronic circuit module includes at least one of a digital signal processor, a power processor core, a flip-flop circuit, a logic gate circuit, and a latch circuit.

16. The electronic circuit of claim 8, wherein the second electronic circuit module includes at least one of a digital signal processor, a power processor core, a flip-flop circuit, a logic gate circuit, and a latch circuit.

17. A method for testing an electronic circuit by an external testing apparatus, wherein the electronic circuit includes first and second electronic circuit modules that operate on first and second clock frequencies and include first and second memory blocks and first and second built-in-self-test (BIST) engines respectively, comprising:
initiating the first BIST engine to generate first memory repair data corresponding to the first memory block during a first test cycle corresponding to the first clock frequency;
storing the first memory repair data in a shadow register;
initiating the second BIST engine to generate a second memory repair data corresponding to the second memory block during a second test cycle corresponding to the second clock frequency; and
transmitting the first and second memory repair data sequentially to a fuse processor by way of the shadow register, during the second test cycle.

18. The method of claim 17, further comprising providing the first and second memory repair data to the first and second electronic circuit modules respectively by the fuse processor, when the electronic circuit transitions from an OFF state to an ON state.

* * * * *